United States Patent
Hasunuma et al.

[19]

[11] Patent Number: 5,856,892
[45] Date of Patent: Jan. 5, 1999

[54] RECORDING APPARATUS WITH A CONTROL FOR SELECTING A GAIN ADJUSTMENT AMOUNT

[75] Inventors: Yoshitaka Hasunuma; Susumu Kikuchi; Nobumasa Kabe; Minoru Fujita; Seiichi Fujita, all of Tokorozawa, Japan

[73] Assignee: Pioneer Electronic Corporation, Tokyo, Japan

[21] Appl. No.: 760,277

[22] Filed: Dec. 4, 1996

[30] Foreign Application Priority Data

Dec. 19, 1995 [JP] Japan .................................. 7-348795

[51] Int. Cl.⁶ ........................................................ G11B 5/02

[52] U.S. Cl. .............................................. 360/68; 360/27

[58] Field of Search .................................. 369/47, 48, 53, 369/124, 44.35, 44.36; 360/25, 27, 46, 65, 67, 68

[56] References Cited

U.S. PATENT DOCUMENTS

| 4,274,117 | 6/1981 | Tomita | 360/68 |
| 5,101,310 | 3/1992 | Brown | 360/68 |
| 5,606,544 | 2/1997 | Katsuhara | 369/124 |
| 5,694,386 | 12/1997 | Hirajima et al. | 369/124 |

*Primary Examiner*—Paul W. Huber
*Attorney, Agent, or Firm*—Sughrue, Mion, Zinn, Macpeak & Seas, PLLC

[57] ABSTRACT

A recording apparatus in which a level of an input signal is adjusted by a variable gain amplifying circuit, and the input signal is recorded onto a recording medium. The level of the input signal is detected, a gain adjustment amount of the variable gain amplifying circuit is determined in accordance with the level of the input signal, a gain of the variable gain amplifying circuit is changed by the determined gain adjustment amount, and the gain adjustment amount is increased as the level of the input signal becomes larger. When the input signal level is low, therefore, the gain control amount is suppressed and, when a possibility such that the input signal level is the peak level of the music source is high and the input signal level is large, the gain adjustment amount is increased in accordance with the input signal level.

4 Claims, 7 Drawing Sheets

RECORDING APPARATUS WITH A CONTROL FOR SELECTING A GAIN ADJUSTMENT AMOUNT

BACKGROUND OF THE INVENTION

1. Field of the Invention

The present invention relates to a recording apparatus for automatically adjusting a level of a recording signal.

2. Description of the Related Art

In a conventional recording apparatus such as a tape recorder, an audio signal as an input signal is supplied to a signal recording stage through a variable gain amplifying circuit such as a VCA (voltage controlled amplifier). When a level of a recording signal as an output signal of the variable gain amplifying circuit is smaller than a target signal level, a gain of the variable gain amplifying circuit is increased and, when the recording signal level exceeds the target recording level, the gain of the variable gain amplifying circuit is reduced. Thus, the recording signal level is controlled so as to coincide with the target recording level.

When a state in which an input signal level is low continues after the start of the recording, however, since the gain of the variable gain amplifying circuit is raised on the basis of the low signal level, the gain is extremely high. When a peak of the input signal appears after that the high gain was obtained as mentioned above, the recording signal level is fairly higher than the target recording level and there is a problem such that the signal recorded on a recording medium is remarkably distorted at the signal recording stage.

SUMMARY AND OBJECTS OF THE INVENTION

It is an object of the present invention to provide a recording apparatus for automatically adjusting a recording signal level to a proper level.

According to the present invention, there is provided a recording apparatus for recording a signal onto a recording medium, comprising: level adjusting means for adjusting a level of an input signal to a level corresponding to its own gain; recording means for recording a signal output from the level adjusting means onto a recording medium; input level detecting means for detecting the level of the input signal; and control means for deciding a gain adjustment amount of the level adjusting means in accordance with the level of the input signal and for changing the gain of the level adjusting means by the decided gain adjustment amount, wherein the control means increases the gain adjustment amount as the level of the input signal is larger.

According to the present invention, there is provided a recording apparatus for recording a signal onto a recording medium, comprising: level adjusting means for adjusting a level of an input signal to a level corresponding to its own gain; recording means for recording a signal output from the level adjusting means onto a recording medium; input level detecting means for detecting the level of the input signal; recording level detecting means for detecting the level of the signal output from the level adjusting means as a recording signal level; and control means for deciding a gain adjustment amount of the level adjusting means in accordance with the level of the input signal and the recording signal level and for changing the gain of the level adjusting means by the decided gain adjustment amount, wherein as the level of the input signal is larger, the control means increases the gain adjustment amount and, as the recording signal level approaches a target recording level, the control means reduces the gain adjustment amount.

DETAILED DESCRIPTION OF THE PREFERRED EMBODIMENTS

An embodiment of the present invention will now be described in detail hereinbelow with reference to the drawings.

Figure 1:
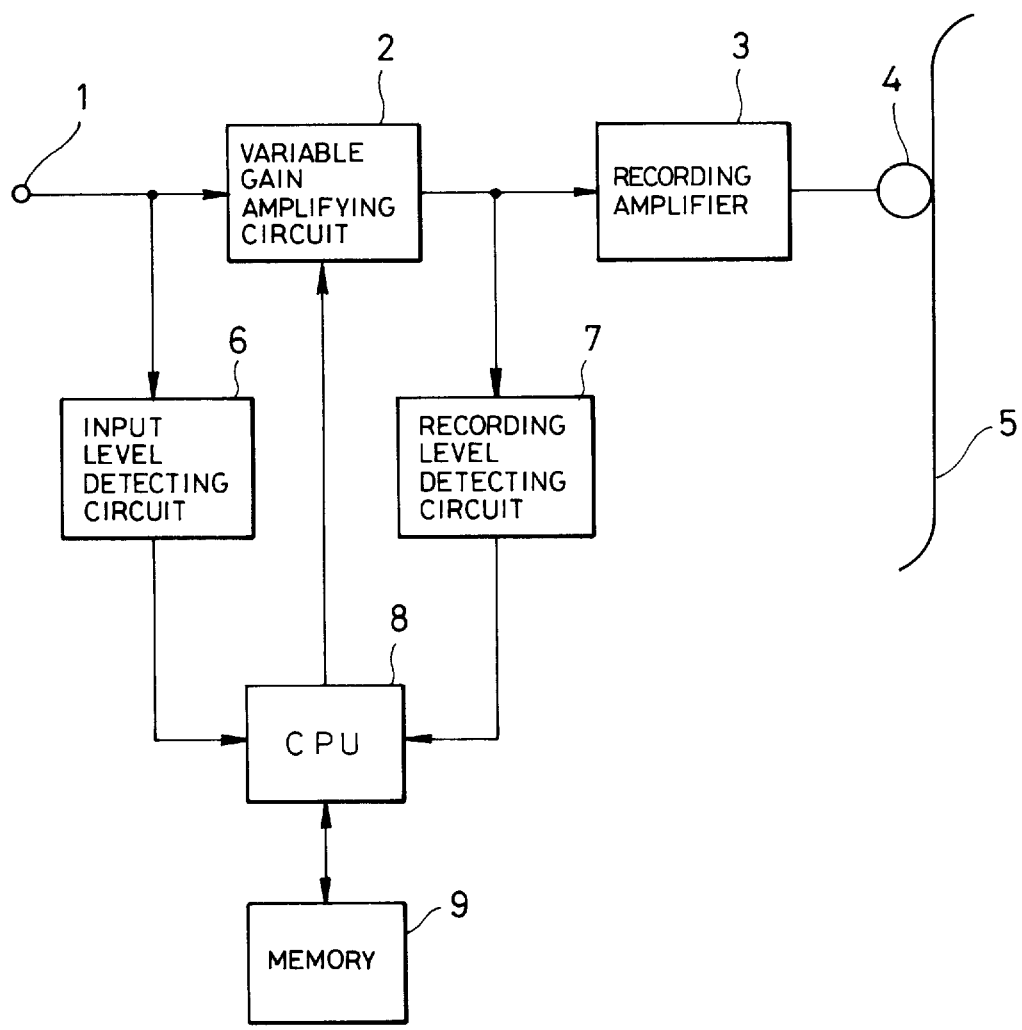
FIG. 1 is a block diagram showing an embodiment of the present invention.

FIG. 1 shows the embodiment of the present invention. In a recording apparatus shown in FIG. 1, an audio signal as an information signal supplied to an input terminal 1 is amplified by a variable gain amplifying circuit 2 as level adjusting means and, after that, the amplified signal is supplied to a recording amplifier 3. The recording amplifier 3 amplifies a recording signal as a signal generated from the variable gain amplifying circuit 2 and supplies the amplified signal to a recording head 4. The recording head 4 records the signal supplied from the recording amplifier 3 onto a magnetic tape 5. An input level detecting circuit 6 for detecting a level of the input signal is connected to the input terminal 1. A recording level detecting circuit 7 for detecting the level of the recording signal generated from the variable gain amplifying circuit 2 is connected to an output of the variable gain amplifying circuit 2. The recording level detecting circuit 7 can also detect the output signal level of the recording amplifier 3. The respective levels detected by the input level detecting circuit 6 and recording level detecting circuit 7 are supplied to a CPU (central processing unit) 8. A memory 9 in which a gain adjustment table has been stored is connected to the CPU 8. The CPU 8 controls a gain of the variable gain amplifying circuit 2 at predetermined intervals of time (for example, two seconds) in accordance with the detected levels of the input level detecting circuit 6 and recording level detecting circuit 7 by using the gain adjustment table in the memory 9. When the level of the recording signal reaches the target recording level, the CPU 8 finishes the gain control operation.

Figure 2:
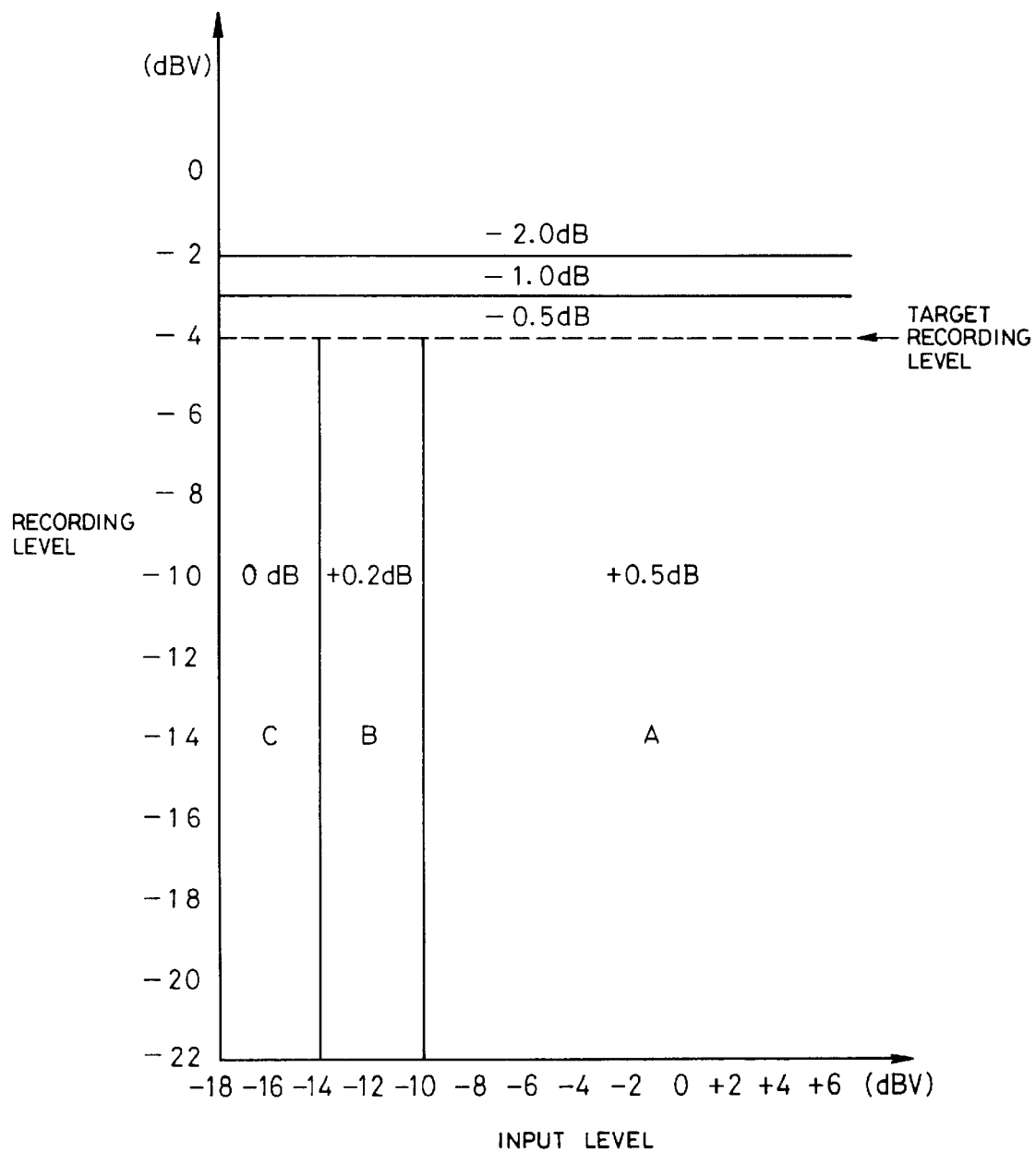
FIG. 2 is a diagram showing a gain adjustment table.

In the gain adjustment table stored in the memory 9, the gain adjustment amount of the variable gain amplifying circuit 2 corresponding to the input signal level and recording signal level has been determined as shown in FIG. 2. The gain adjustment table shows an example when the target recording level is set to −4 dBV as shown by a broken line in FIG. 2. When the recording signal level is equal to or lower than the target recording level, boundaries are set to −14 dBV and −10 dBV for the input signal level. The gain adjustment amount in an area A of −10 dBV or more is equal to +0.5 dB. The gain adjustment amount is equal to +0.2 dB in an area B within a range from −14 dBV or more to −10 dBV or less. In an area C whose range is less than −14 dBV, the gain adjustment amount is equal to 0.0 dB. That is, when the recording signal level is equal to or less than the target recording level, as the input signal level increases, the gain adjustment amount is large.

On the other hand, when the recording signal level exceeds the target recording level, the recording signal level is decreased by reducing the gain of the variable gain amplifying circuit 2 so as not to exceed the target recording level. As for the gain adjustment amount in this case, the area is not divided with respect to the input signal level but the area division is executed with regard to the recording signal level. That is, when the recording signal level exceeds −4 dBV as a target recording level and is equal to or less than −3 dBV, the gain adjustment amount is equal to −0.5 dB. When the recording signal level exceeds −3 dBV and is equal to or less than −2 dBV, the gain adjustment amount is equal to −1.0 dB. When the recording signal level exceeds −2 dBV, the gain adjustment amount is equal to −2.0 dB. As the recording signal level approaches the target recording level, the gain adjustment amount is reduced. This is because when the recording signal level is away from the target recording level, the recording signal level is immediately controlled to approach the target recording level and, when the recording signal level approaches the target recording level, the recording signal level is enabled to be adjusted at a high precision.

Peak levels of music signals obtained from a compact disc, an FM broadcast, a cassette tape, and the like which are generally used as music sources are almost equal to or higher than −10 dBV. In the case of the compact disc, particularly, the peak level is further high and is equal to +6 dBV. The gain adjustment table is, therefore, decided as follows: The gain is largely adjusted for the input signal level that is considered to be a peak level; the gain adjustment is reduced for the input signal level which is equal to or lower than the peak level; and the gain adjustment is not performed for a further micro input signal level.

The specific operation of the recording apparatus will now be described hereinbelow with reference to FIGS. 2 to 4. The CPU 8 first sets the target recording level serving as a target of the gain adjustment. As a target recording level, a level which has been preset in the memory 9 can be used or a level decided by the user can be also used. It is assumed that the target recording level has been set to −4 dBV as mentioned above.

Figure 3:
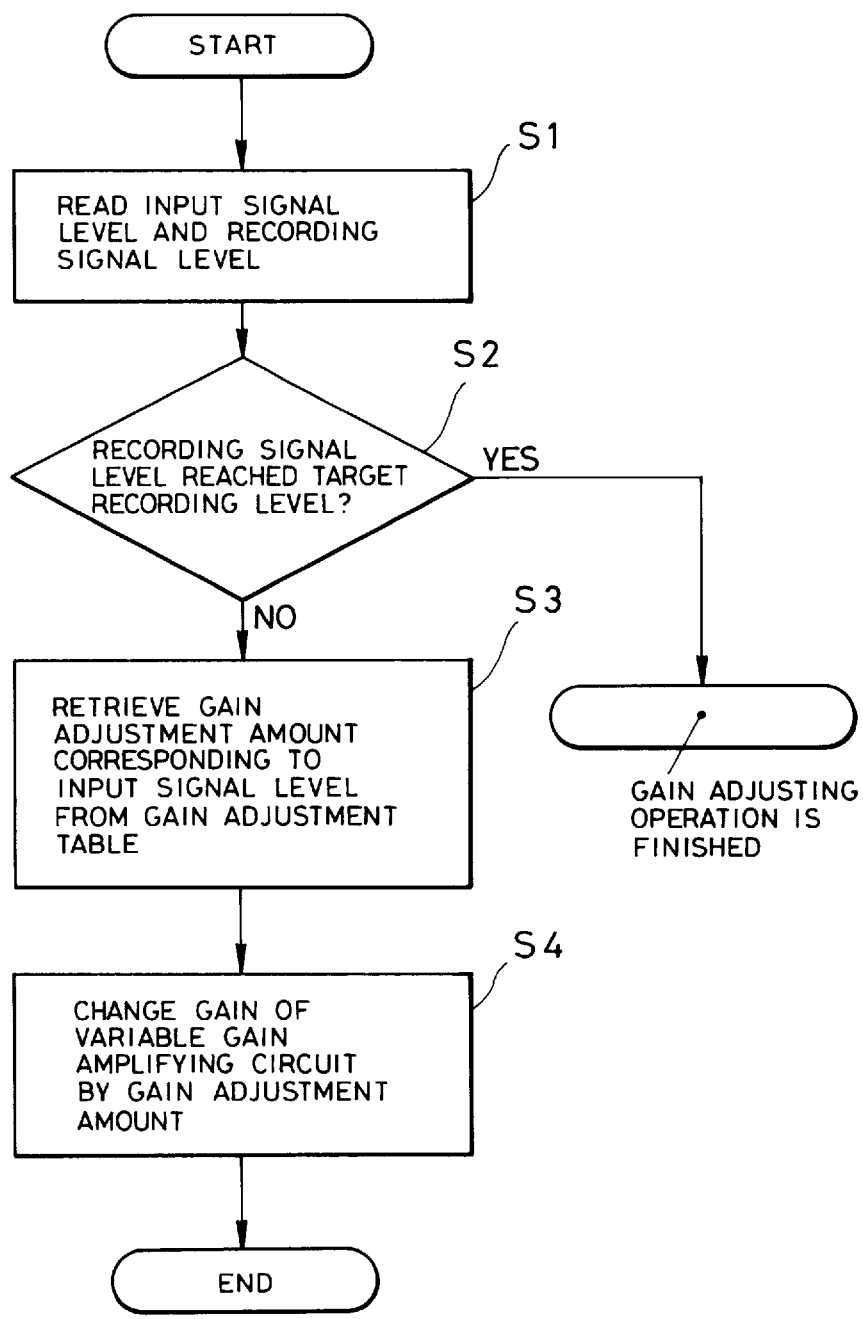
FIG. 3 is a flowchart showing the operation of a CPU in an apparatus in FIG. 1.

As shown in FIG. 3, after the target recording level is set, the CPU 8 reads out input and recording levels detected respectively by the input level detecting circuit 6 and recording level detecting circuit 7 every two seconds (step S1) and discriminates whether the read-out recording signal level has reached the target recording level or not (step S2). If NO, the CPU 8 obtains the gain adjustment amount by retrieving from the gain adjustment table in accordance with the read-out input signal level (step S3) and changes the gain of the variable gain amplifying circuit 2 by the gain adjustment amount (step S4). If YES, the gain adjusting operation is finished.

Figure 4A:
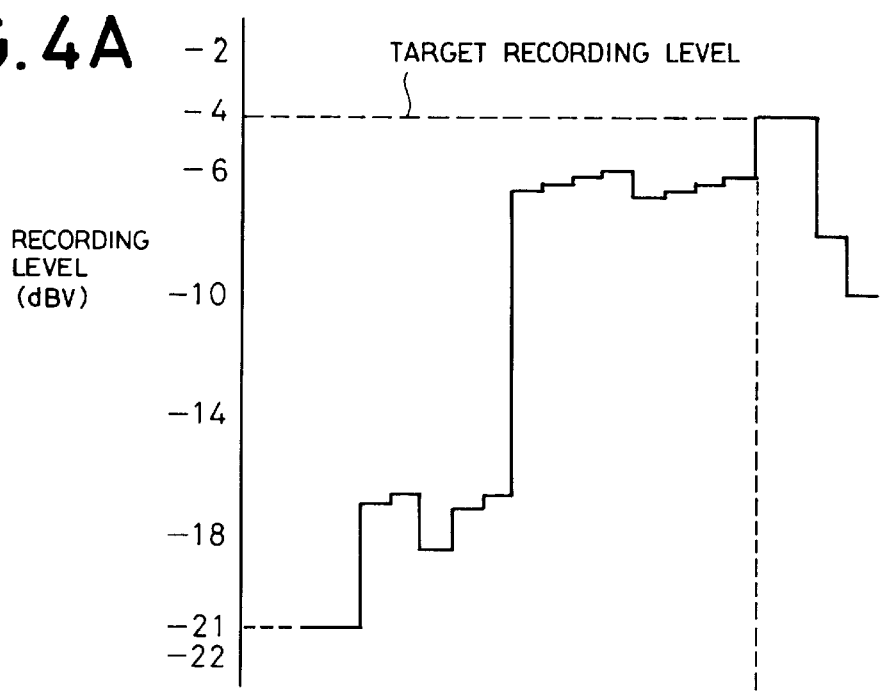
FIGS. 4A to 4C are diagrams showing examples of the level adjusting operation when using the gain adjustment table in FIG. 2.
Figure 4B:
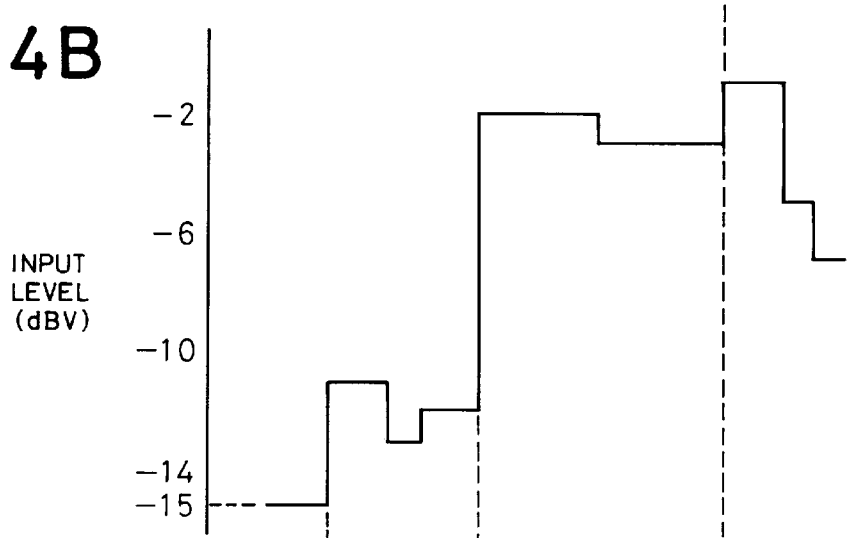
Figure 4C:
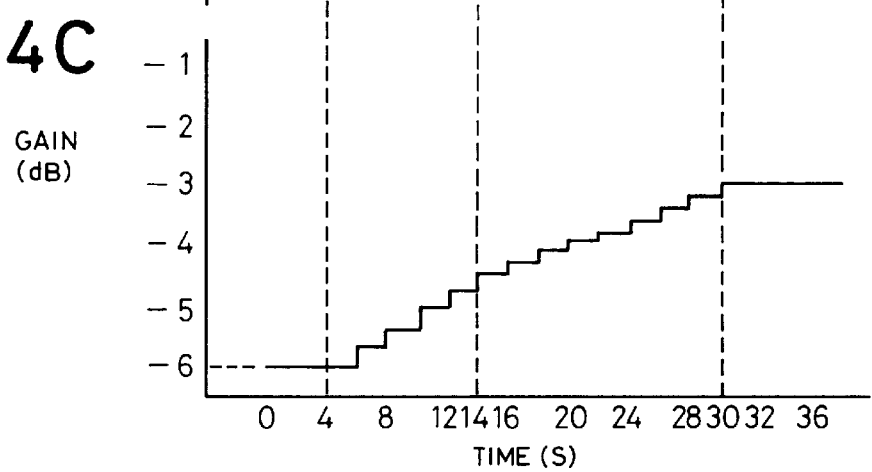

When it is assumed that the input signal has an initial level of −15 dBV as shown in FIG. 4B and the initial gain of the variable gain amplifying circuit 2 is equal to −6 dB as shown in FIG. 4C, the recording signal level becomes equal to −21 dBV as shown in FIG. 4A. The initial gain is selected in consideration of the target recording level, a distortion amount when the peak level is supplied, and a noise sense when the input signal is at the low level. For the first four seconds during which −15 dBV that is a micro level as an input signal level continues, since an area in the gain adjustment table decided from the input signal level corresponds to the area C, the gain adjustment amount is equal to 0 dB and the gain of the variable gain amplifying circuit 2 is not adjusted. After that, when the input signal level rises to a value over −14 dBV and the recording signal level rises in association with it, an area in the gain adjustment table corresponds to the area B. The gain increases, therefore, by the gain adjustment amount of +0.2 dB at a time. As shown in FIG. 4B, after the elapse of 14 seconds, when the input signal level further increases and approaches the peak level or a level near the peak level, since the input signal level exceeds −10 dBV, an area in the gain adjustment table corresponds to the area A. When the detected input level belongs to the area A, the gain increases by the gain adjustment amount of +0.5 dB at a time. After the elapse of 30 seconds, the recording signal level reaches −4 dBV as a target recording level and the gain adjusting operation is finished. After that, the recording is performed at the gain at the end of the adjustment.

After completion of the gain adjustment, the CPU 8 discriminates whether the recording signal level has exceeded the target recording level or not. If YES, the CPU 8 retrieves and obtains the gain adjustment amount from the gain adjustment table in accordance with the read-out recording signal level and performs a control to reduce the gain of the variable gain amplifying circuit 2 by the gain adjustment amount.

As mentioned above, when the input signal level is low, the gain control amount is suppressed. When a possibility such that the input signal level is equal to the peak level of the music source is high and the input signal level is high, the gain adjustment amount is increased in accordance with the input signal level. Even in case of a music signal indicative of a music piece such that the low input signal level continues from the start of the recording and the peak level occurs after the elapse of a certain time, therefore, it is possible to prevent that the recording signal level largely exceeds the target recording level.

Figure 5:
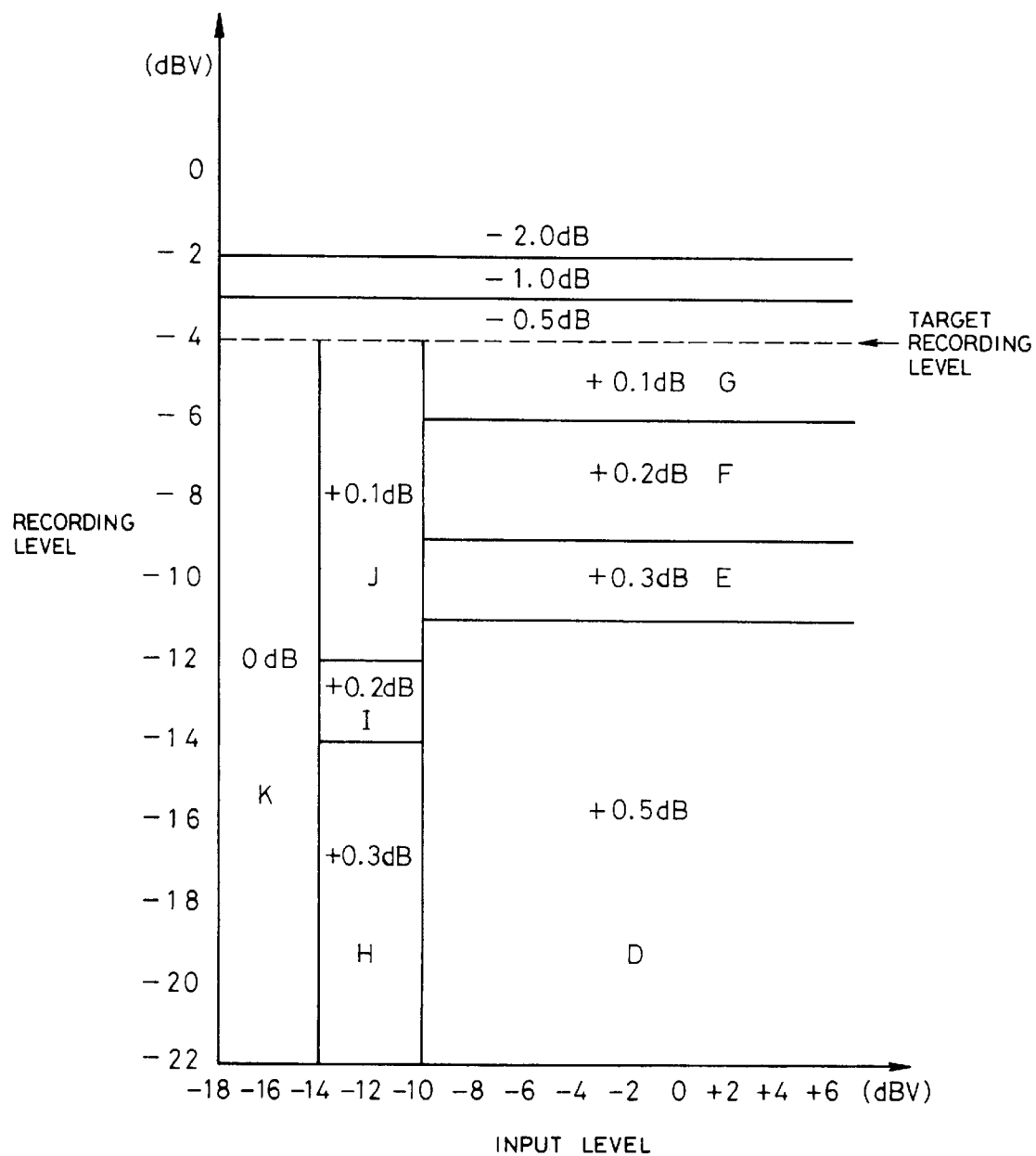
FIG. 5 is a diagram showing the gain adjustment table.

FIG. 5 shows another example of the gain adjustment table stored in the memory 9. In a manner similar to FIG. 2, the gain adjustment table shows the example when the target recording level is set to −4 dBV as shown by a broken line in FIG. 5. Even when the recording signal level is equal to or less than the target recording level, the gain adjustment amount of the variable gain amplifying circuit 2 is decided in accordance with the input signal level and the recording signal level. That is, the area in which the recording signal level is determined accordance with the input signal level that is equal to or less than the target recording level and the recording signal level is divided into eight areas D to K. For the input signal level, in a manner similar to the case in FIG. 2, as the input signal level rises, the gain adjustment amount increases. As for the recording signal level, as the recording signal level approaches the target recording level, the gain adjustment amount decreases. This is because it is necessary to control in a manner such that when the recording signal level is away from the target recording level, the recording signal level is immediately controlled to approach the target recording level by increasing the gain adjustment amount and, when the recording signal level approaches the target recording level, the gain adjustment amount is reduced, thereby raising a precision of the adjustment. When the recording signal level exceeds the target recording level, in a manner similar to the gain adjustment table in FIG. 2, the area is divided with respect to the recording signal level.

The specific operation of the recording apparatus in which the gain adjustment table of FIG. 5 is provided in the memory 9 will now be described hereinbelow. The CPU 8 first sets the target recording level serving as a target of the gain adjustment. As a target recording level, the level which has been preset in the memory 9 can be used or the level decided by the user can be also used. It is now assumed that the target recording level has been set to −4 dBV as mentioned above.

Figure 6:
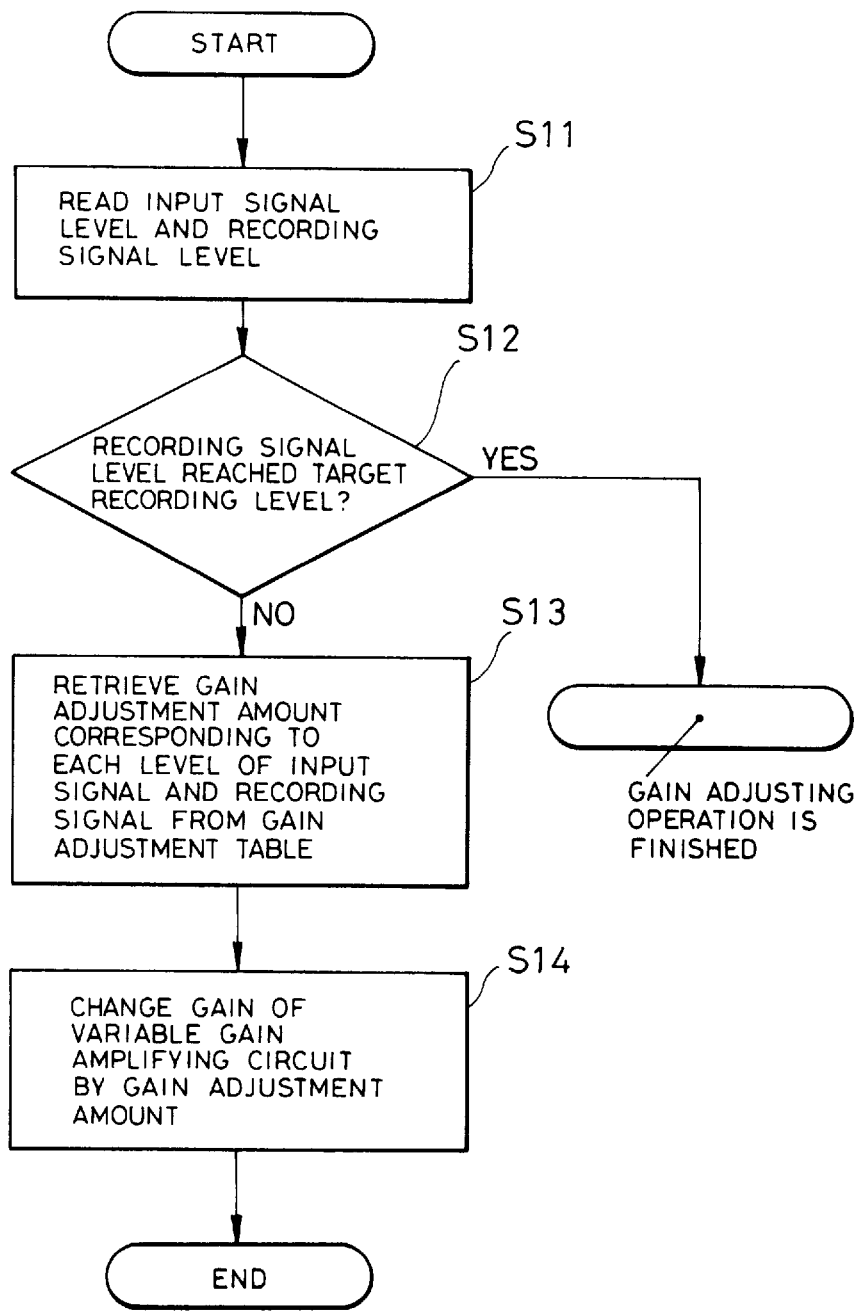
FIG. 6 is a flowchart showing the operation of the CPU in the apparatus in FIG. 1.

As shown in FIG. 6, after the target recording level is set, the CPU 8 reads out input and recording levels detected by the input level detecting circuit 6 and recording level detecting circuit 7 every two seconds (step S11) and discriminates whether the read-out recording signal level has reached the target recording level or not (step S12). If NO, the CPU 8 retrieves and obtains the gain adjustment amount from the gain adjustment table in accordance with the read-out input signal level and recording signal level (step S13) and changes the gain of the variable gain amplifying circuit 2 by only the gain adjustment amount (step S14). If YES, the gain adjusting operation is finished.

Figure 7A:
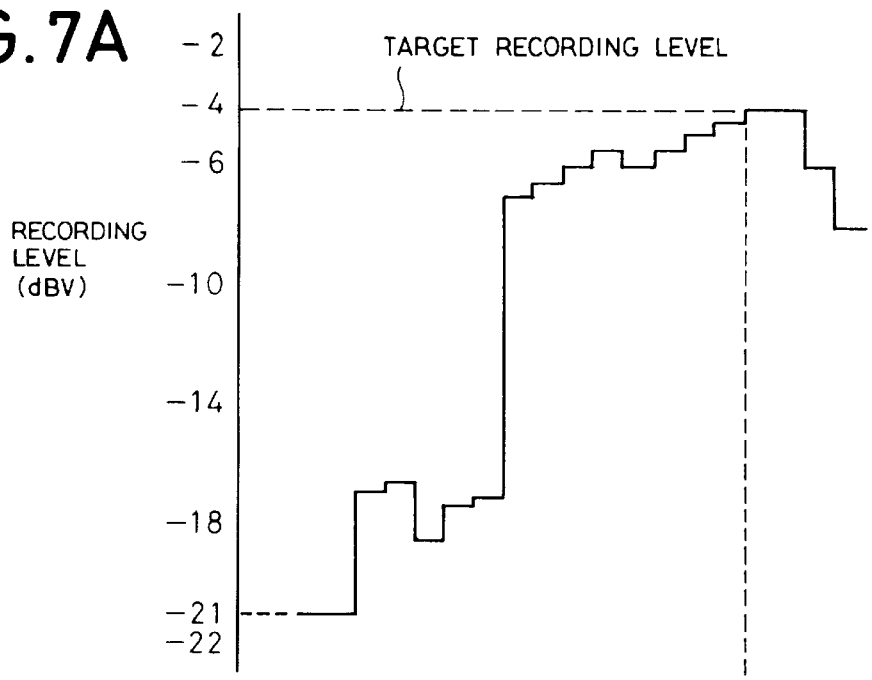
FIGS. 7A to 7C are diagrams showing examples of the level adjusting operation when using the gain adjustment table in FIG. 5.
Figure 7B:
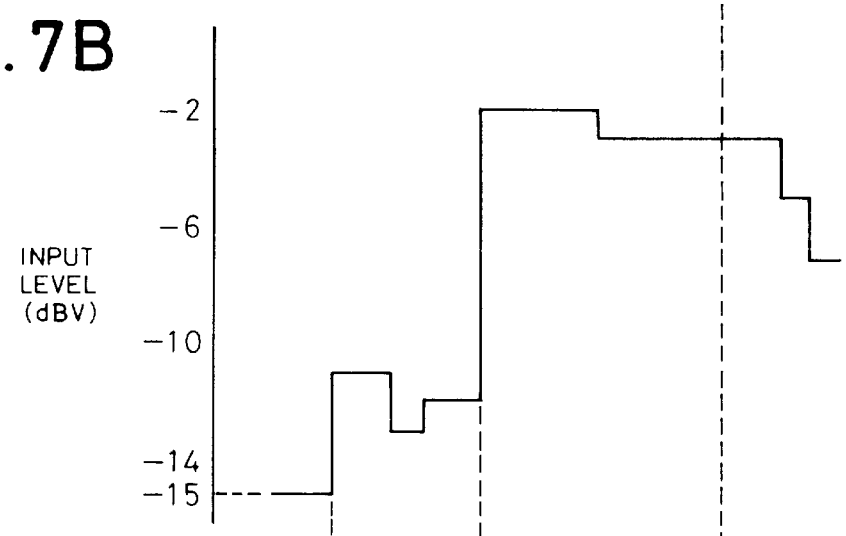
Figure 7C:
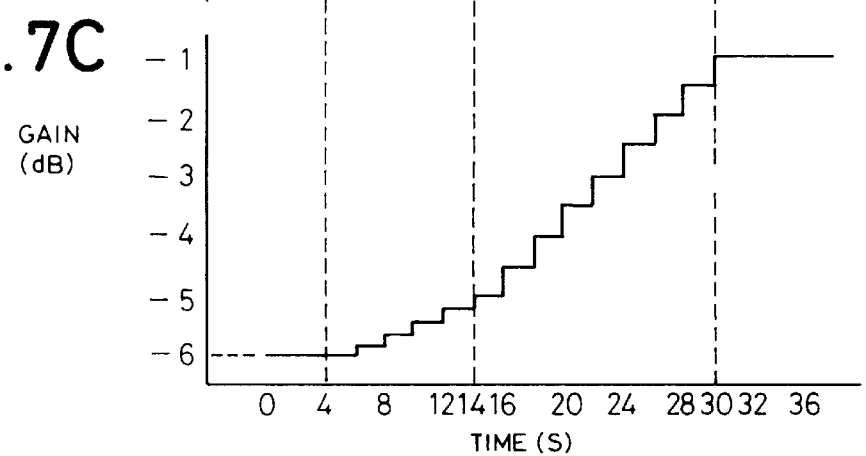

As shown in FIG. 7B, the input signal has an initial level of −15 dBV. When it is assumed that the initial gain of the variable gain amplifying circuit 2 is equal to −6 dB as shown in FIG. 7C, the recording signal level is equal to −21 dBV as shown in FIG. 7A. For first four seconds during which the input signal level of −15 dBV as a micro level continues, since an area in the gain adjustment table which is determined by the input signal level and recording signal level corresponds to the area K, the gain adjustment amount is equal to 0 dB and the gain adjustment of the variable gain amplifying circuit 2 is not performed. After that, when the input signal level rises a value over −14 dBV and the recording signal level rises in association with it, an area in the gain adjustment table corresponds to any one of the areas H, I, and J in accordance with the recording signal level at that time. In case of the area H, therefore, the gain increases by the gain adjustment amount of +0.3 dB at a time, in case of the area I, the gain increases by the gain adjustment amount of +0.2 dB at a time, and in case of the area J, the gain increases by the gain adjustment amount of +0.1 dB at a time. In FIG. 7A, since the recording signal level is located near −18 dBV within a range of 4 to 14 seconds, the detected levels belong to the area H and the gain increases by +0.3 dB at a time as shown in FIG. 7C.

As shown in FIG. 7B, after the elapse of 14 seconds, when the input signal level further rises and reaches the peak level or a level near the peak level, since the input signal level exceeds −10 dBV, an area in the gain adjustment table corresponds to any one of the areas D to G in accordance with the recording signal level at that time. In FIG. 7A, since the recording signal level is located near −6 dBV within a range of 14 to 30 seconds, the detected signal levels belong to the area F or G. When the detected signal levels belong to the area F, the gain increases by the gain adjustment amount of +0.2 dB at a time and, when the detected levels belong to the area G, the gain increases by the gain adjustment amount +0.1 dB at a time. The gain adjustment is, therefore, performed by a small gain adjustment amount at a high precision. After the elapse of 30 seconds, the recording signal level reaches −4 dBV as a target recording level and the gain adjustment is finished. After that, the recording is performed at the gain at the end of the adjustment.

After completion of the gain adjustment, a control in accordance with the gain adjustment table is performed such that only when the recording signal level exceeds the target recording level, the gain is reduced so as not to exceed the target recording level. Even in the gain adjustment table of FIG. 5, as the recording signal level is away from the target recording level, the gain adjustment amount is increased and, as the recording signal level approaches the target recording level, the gain adjustment amount is reduced, so that a high-precision adjustment can be promptly performed.

In the embodiment, although the input level detecting circuit 6 for detecting the input signal level has been provided, the input signal level can also be calculated and obtained in accordance with the detected signal level by the recording level detecting circuit 7 and the gain adjustment amount.

It will be obviously understood that the input signal is not limited to the audio signal but other information signal such as a video signal can be also used.

According to the present invention, as mentioned above, when the input signal level is low, the gain control amount is suppressed and, when a possibility such that the input signal level is the peak level of the music source is high and the input signal level is large, the gain adjustment amount is increased in accordance with the input signal level at that time. Even in case of a music signal of a music piece in which a low input signal level continues from the start of the recording and the peak value occurs after the elapse of a certain period of time, therefore, it is possible to prevent the input signal level from greatly exceeding the target recording level when the peak level comes.

What is claimed is:

1. A recording apparatus for recording a signal onto a recording medium, comprising:

level adjusting means for adjusting a level of an input signal to a level corresponding to its own gain;

recording means for recording a signal output from said level adjusting means onto said recording medium;

input level detecting means for detecting the level of said input signal; and control means for deciding a gain adjustment amount of said level adjusting means in accordance with the level of said input signal and for changing the gain of said level adjusting means by the decided gain adjustment amount, wherein said control means increases said gain adjustment amount as the level of said input signal is large, so that the gain of said level adjusting means is increased.

2. A recording apparatus for recording a signal onto a recording medium, comprising:

level adjusting means for adjusting a level of an input signal to a level corresponding to its own gain;

recording means for recording a signal output from said level adjusting means onto said recording medium;

input level detecting means for detecting the level of said input signal;

recording level detecting means for detecting the level of the signal output from said level adjusting means as a recording signal level; and control means for deciding a gain adjustment amount of said level adjusting means in accordance with the level of said input signal and said recording signal level and for changing the gain of said level adjusting means by the decided gain adjustment amount, wherein said control means increases said gain adjustment amount as the level of said input signal is larger and reduces said gain adjustment amount as said recording signal level approaches a target recording level.

3. A recording apparatus for recording a signal onto a recording medium, comprising:

a variable gain amplifying circuit receiving an input signal and outputting the signal with a level adjusted in accordance with the gain of said amplifying circuit;

recording circuitry for recording the signal output from said amplifying circuit onto said recording medium;

an input level detecting circuit for detecting the level of the input signal; and a processor controlling the gain of said amplifying circuit in accordance with a level of the input signal in such a manner that greater input signal levels correlate to greater increases in the gain.

4. The recording apparatus according to claim 3, further comprising an output level detecting circuit for detecting the adjusted level of the signal output by said variable gain amplifying circuit; and wherein said processor further controls the gain of said amplifying circuit in accordance with the adjusted level of the signal output by said variable gain amplifying circuit in such a manner that lesser differences between the adjusted level of the output signal and a target recording level correlate to lesser increases in the gain.

* * * * *